(12) United States Patent
Kuma et al.

(10) Patent No.: US 6,844,670 B2
(45) Date of Patent: Jan. 18, 2005

(54) COLOR LUMINOUS DEVICE

(75) Inventors: Hitoshi Kuma, Sodegaura (JP); Mitsuru Eida, Sodegaura (JP); Chishio Hosokawa, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 104 days.

(21) Appl. No.: 10/283,342

(22) Filed: Oct. 30, 2002

(65) Prior Publication Data

US 2003/0127968 A1 Jul. 10, 2003

(30) Foreign Application Priority Data

Nov. 15, 2001 (JP) ........................ 2001-350278

(51) Int. Cl.⁷ .................................. H01J 1/62
(52) U.S. Cl. .................. 313/501; 313/503; 313/506; 313/112
(58) Field of Search ................ 313/498–512, 313/110, 112, 11

(56) References Cited

U.S. PATENT DOCUMENTS

| | | | | |
|---|---|---|---|---|
| 5,909,081 A | * | 6/1999 | Eida et al. .................. | 313/504 |
| 6,037,712 A | * | 3/2000 | Codama et al. ............. | 313/498 |
| 6,072,450 A | * | 6/2000 | Yamada et al. ............. | 345/76 |
| 6,084,347 A | * | 7/2000 | Xu et al. ..................... | 313/503 |
| 6,121,726 A | * | 9/2000 | Codama et al. ............. | 313/504 |
| 6,191,764 B1 | * | 2/2001 | Kono et al. ................. | 345/76 |
| 6,653,778 B1 | * | 11/2003 | Tomiuchi et al. ........... | 313/501 |

FOREIGN PATENT DOCUMENTS

| | | |
|---|---|---|
| JP | 09-330793 | 12/1997 |
| JP | 10-162958 | 6/1998 |
| JP | 10-255983 | 9/1998 |
| JP | 2001-171175 | 6/2001 |
| JP | 2001-196175 | 7/2001 |
| JP | 2002-184575 | 6/2002 |

* cited by examiner

Primary Examiner—Nimeshkumar D. Patel
Assistant Examiner—German Colón
(74) Attorney, Agent, or Firm—Parkhurst & Wendel, L.L.P.

(57) ABSTRACT

An organic EL element (100) emits light containing blue, green and red components. A blue color filter (420) transmits only the blue component. A green-converting member (340) converts the blue component to the green component, and a green color filter (440) transmits only the green component. A red-converting member (360) converts the blue component and the green component to the red component, and a red color filter (460) transmits only the red component. Since the respective color filters (420, 440 and 460) block unnecessary color components, the reproducibility of the respective color is improved. Since the luminescence of the organic EL element (100) contains the green component and the red component besides the blue component, white balance becomes good. It is therefore possible to provide a color luminous device from which improved light rays in the three primary colors can be emitted.

6 Claims, 6 Drawing Sheets

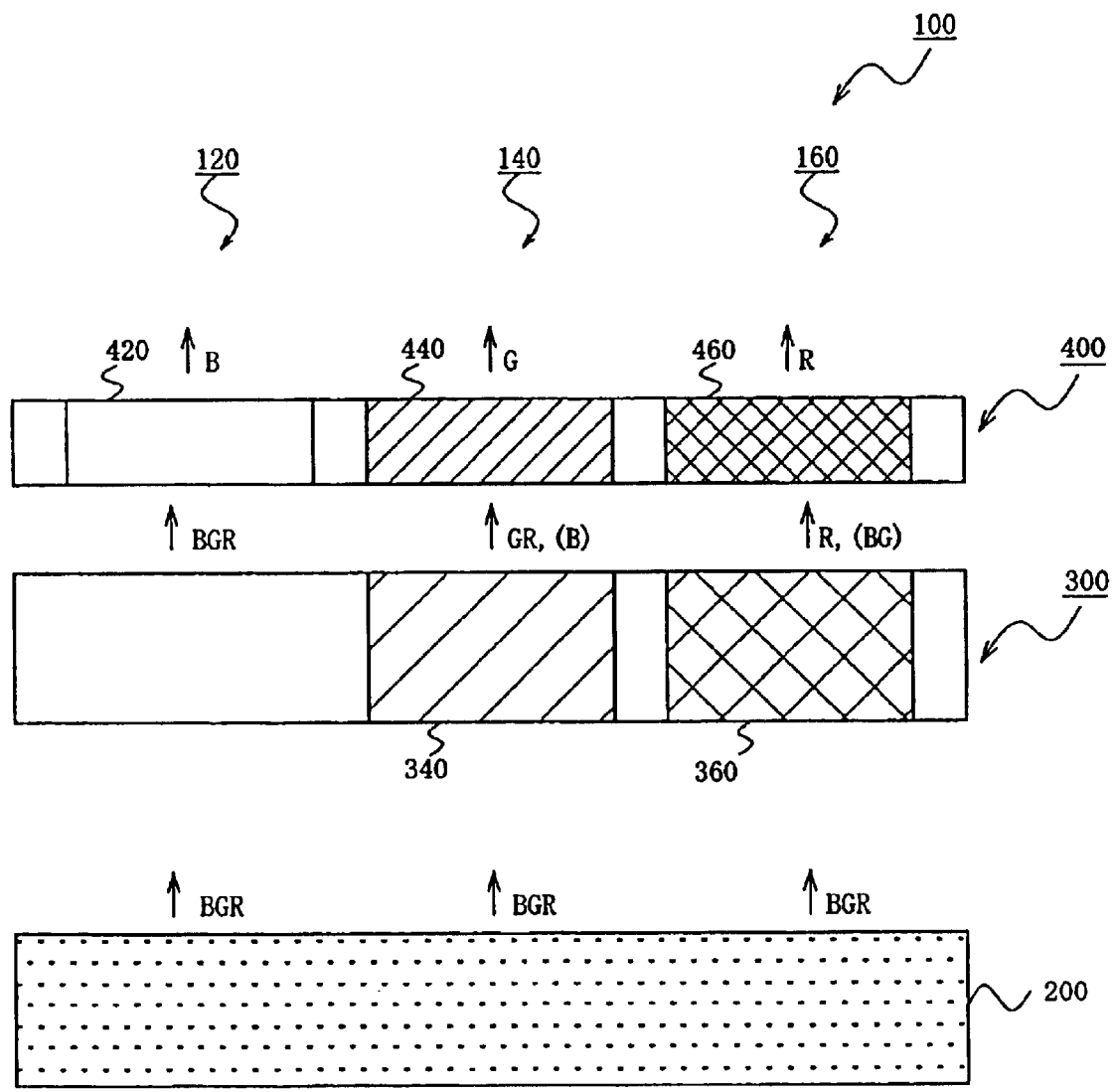

COLOR LUMINOUS DEVICE

TECHNICAL FIELD

The present invention relates to a color luminous device, in particular, a color luminous device using an organic electroluminescence (EL) element.

BACKGROUND ART

In order to use a luminous element to make a color display device such as a television, it is necessary to form pixels which emit light rays in the three primary colors of blue, green and red. As a process for making such pixels, color conversion process is known.

FIG. 6 is a schematic view of a color luminous device described in U.S. Pat. No. 6,084,347, using the color conversion process. In this figure, reference number 10 represents a color luminous device; 20, an organic EL element which emits bluish green color light; 32, a first light-adjusting member; 34, a second light-adjusting member; and 36, a third light-adjusting member. A conversion layer of the first light-adjusting member 32 absorbs the green component of the light emitted by the organic EL element 20 to transmit only the blue component thereof. The second light-adjusting member 34 absorbs the blue component of the light emitted by the organic EL element 20 to emit green fluorescence and transmit the green component thereof. The third light-adjusting member 36 absorbs the blue and green components of the light emitted by the organic EL element 20 and emits red fluorescence. In the color luminous device 10 of this publication, each of the light-adjusting members 32, 34 and 36 contains a fluorescent dye which absorbs a specific color and emits fluorescence in a different color, or a color filter pigment which blocks the transmission of a specific color in a mixture form.

However, in the second light-adjusting member 34 which emits green light and the third light-adjusting member 36 which emits red light, it is difficult to absorb sufficiently the blue component, which excites the fluorescent dye to emit fluorescence, from among the luminous components from the organic EL element, so that the blue component is not transmitted. It is therefore impossible to exhibit chromaticity close to the standard three primary colors of NTSC.

The present invention has been made in light of the above-mentioned situation, and an object thereof is to provide a color luminous device which can emit the three primary colors improved.

DISCLOSURE OF THE INVENTION

As means for solving the above-mentioned problems, the following three manners were considered.

(1) The concentration of the fluorescent dye in the light-adjusting member is made sufficiently large.
(2) Such a color filter pigment or dye as is used in a color filter for a liquid crystal display is dispersed in the light-adjusting member.
(3) The fluorescent dye and the color filter pigment contained in the light-adjusting member are separated, and the organic EL element and the color-converting member containing the fluorescent dye are formed, followed by laminating a color filter containing the color filter pigment thereon.

The inventors investigated the three manners. As a result, the inventors have found out that according to the (1) and the (2), indeed, the blue component of the organic EL element can be sufficiently absorbed but the fluorescence intensity of green or red lowers to be impractical and the (3) is most effective. Thus, the present invention has been made.

That is, in the above-mentioned related art, the light-adjusting members 34 and 36 (the red luminous member and the green luminous member) contain a fluorescent dye and a color filter pigment in a mixture form, but in the present invention its red pixel and green pixel contain a color-converting member containing a fluorescent dye and a color filter containing a color filter pigment in a separation form.

The following will describe a specific reason for this matter in detail, using numerical equations.

First, a red luminous member which absorbs blue light and emits red fluorescence will be discussed.

The absorbances and the red fluorescent emission intensities of a fluorescent dye (CCM) and a color filter pigment (CF) are defined as follows:

Blue light absorbance per film thickness unit CCM: $b_c$, and CF: $b_f$,

Red light absorbance per film thickness unit CCM: $r_c$, and CF: $r_f$, and

Red fluorescence intensity per film thickness unit CCM: l.

The values of the absorbances herein are each a value obtained by multiplying a measured absorbance by $\log_e 10$.

The reason why the absorbance is multiplied by $\log_e 10$ is as follows.

The damping factor of transmitted light in infinitesimal film thickness dx of the absorbance b per film thickness unit will be discussed. The transmittance can be represented by the following equation:

$$T=10^{-b \cdot dx}=exp(-b \cdot \log 10 \cdot dx) \quad (1)$$

Since dx is sufficiently smaller than one, a expansion can be made as follows:

$$T=exp(-b \cdot \log 10 \cdot dx)=1-b \cdot \log 10 \cdot dx \quad (2)$$

Accordingly, the damping factor in the infinitesimal film thickness dx can be represented by the following:

$$1-T=b \cdot \log 10 \cdot dx \quad (3)$$

Therefore, the value obtained by multiplying an actual absorbance by $\log_e 10$ is defined as absorbance.

First, the third light-adjusting member 36 (red luminous member) of the color luminous device in the above-mentioned related art will be discussed. That is, when a film having a film thickness A, where a fluorescent dye and a color filter pigment are homogeneously dispersed, is irradiated with blue excitation light having an intensity I, the intensity $B(x)$ of transmitted blue light along the film thickness and the intensity $R(x)$ of generated red fluorescence are obtained provided that the irradiated face is represented by x=0.

In the infinitesimal factor dx apart from the irradiated face by the distance x, the variation capacity of the blue light intensity $B(x)$ is the sum of the light quantity absorbed by the fluorescent dye and the light quantity absorbed by the color filter pigment. Therefore, the following equation is satisfied:

$$dB(x)=-b_c B(x)dx - b_f B(x)dx \quad (4)$$

The quantity of red fluorescence generated in the same infinitesimal factor is the quantity obtained by subtracting, from the light quantity generated by excitation based on blue light, the light quantity which is again absorbed by the fluorescent dye and the color filter pigment after the generation. Therefore, the red fluorescence quantity is represented by the following:

$$dR(x) = 1 \cdot B(x)dx - r_c \cdot R(x)dx - r_f R(x)dx \quad (5)$$

On the basis of the above-mentioned equations (4) and (5), the following simultaneous differential equations are satisfied:

$$\frac{dB(x)}{dx} = -bB(x) \quad (6)$$

$$\frac{dR(x)}{dx} = l \cdot B(x) - rR(x)$$

wherein $b = b_c + b_f$ and $r = r_c + r_f$.

By solving the simultaneous differential equation (6), the intensity of the red light generated from the film having a film thickness A can be represented by the following equation:

$$R(A) = \frac{l}{b-r} \cdot [\exp(-rA) - \exp(-bA)] \quad (7)$$

In the case that the fluorescent dye and the color filter pigment hardly absorb the red light, $r \approx 0$ and thus the following equation is met.

$$R_1(A) = \frac{l}{b_c - b_f} \cdot [1 - \exp(-b_c A) \cdot \exp(-b_f A)] \quad (8)$$

The following will discs a case in which there are separated a fluorescent dye which emits red fluorescence as a red pixel of the color luminous device of the present invention, and a color filter pigment for cutting extra blue excitation light. That is, only the fluorescent dye is dispersed in the color-converting member and the absorbance of only the color-converting member is represented by $b_c A$. Only the color filter pigment is dispersed in the color filter and the absorbance of only the color filter is represented by $b_f A$. In this case, red light generated in the color converting-member is equivalent to a case in which the content of the color filter is not present in the equation (8). Therefore, by setting $b_f$ to zero, the red fluorescence intensity R(x) can be obtained from the following equation:

$$R_2(A) = \frac{l}{b_c} \cdot [1 - \exp(-b_c A)] \quad (9)$$

From comparison of $R_1$ with $R_2$, it can easily be understood that since effective blue light is absorbed by the color filter pigment before the blue light excites the fluorescent dye, $R_1$ is smaller than $R_2$.

The above has described the red color-converting member, but the same matter is true for the second light-adjusting member 34 (green luminous member) of the color luminous device in the related art, and a green pixel of the color luminous device of the present invention.

According to the present invention, there is provided a color luminous device, comprising:

an organic electroluminescent element which emits light having a blue component and a green component, and a blue pixel, a green pixel, and a red pixel which emit blue color, green color, and red color, respectively, by receiving the light that the organic electroluminescent element emits, wherein the blue pixel contains a blue color filter which blocks the green component but transmits the blue component, the green pixel contains:

a green-converting member which receives the light that the organic electroluminescent element emits, absorbs the blue component to emit fluorescence of the green component, and transmits the green component, and a green color filter which blocks the blue component but transmits the green component, and the red pixel contains:

a red-converting member which receives the light that the organic electroluminescent element emits and absorbs either one or both of the blue component and the green component to emit fluorescence of a red component, and a red color filter which blocks the blue component and the green component but transmits the red component.

Since the respective color filters block unnecessary color components, the reproducibility of the respective colors is made high.

According to another aspect of the present invention, there is provided a color luminous device, comprising:

an organic electroluminescent element which emits light having a blue component, a green component, and a red component, and a blue pixel, a green pixel, and a red pixel which emit blue color, green color, and red color, respectively, by receiving the light that the organic electroluminescent element emits, wherein the blue pixel contains a blue color filter which blocks the green component and the red component but transmits the blue component, the green pixel contains:

a green-converting member which receives the light that the organic electroluminescent element emits, absorbs the blue component to emit fluorescence of the green component, and transmits the green component and the red component, and a green color filter which blocks the blue component and the red component but transmits the green component, and the red pixel contains:

a red-converting member which receives the light that the organic electroluminescence emits, absorbs either one or both of the blue component and the green component to emit fluorescence of the red component, and transmits the red component, and a red color filter which blocks the blue component and the green component but transmits the red component.

By incorporating the red component into luminescence, the luminance of the red color is made high so that a better white balance can be obtained.

In the color luminous device of the present invention, a substrate, the color filters, the color converting-members, and the organic EL element may be arranged in this order, or a substrate, the organic EL element, the color converting-members, and the color filters may be arranged in this order.

BRIEF DESCRIPTION OF THE DRAWINGS

FIG. 1 is a schematic view illustrating an embodiment of the color luminous device of the present invention;

BEST MODES FOR CARRYING OUT THE INVENTION

Figure 2A:
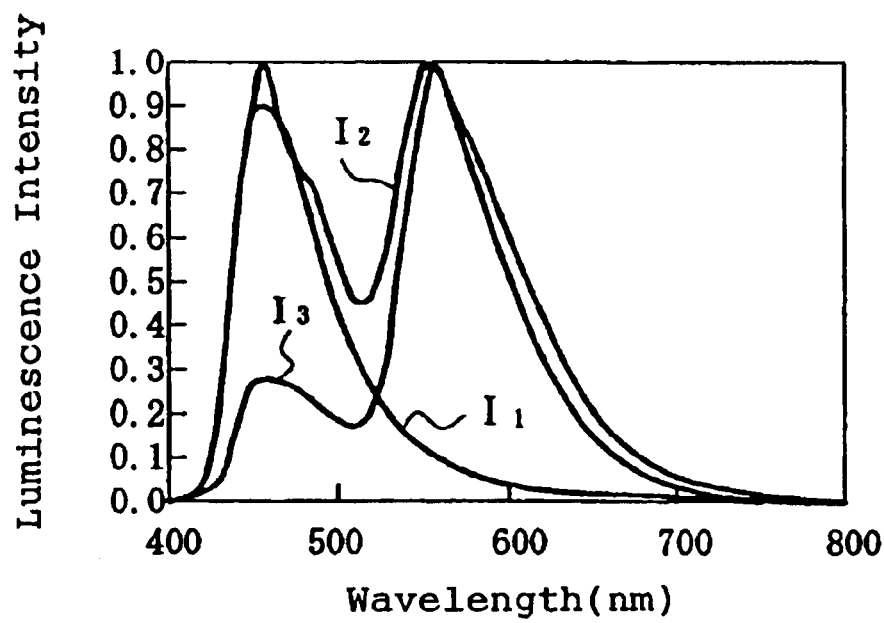
FIG. 2(A) is a graph showing emission spectra of organic EL elements of samples 1 to 3.
Figure 2B:
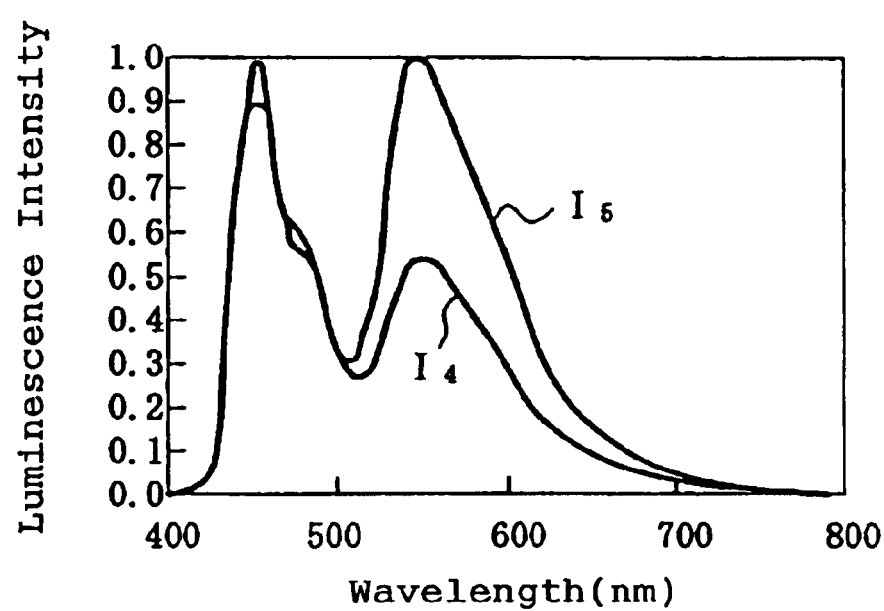
FIG. 2(B) is a graph showing emission spectra of organic EL elements of samples 4 and 5.
Figure 2C:
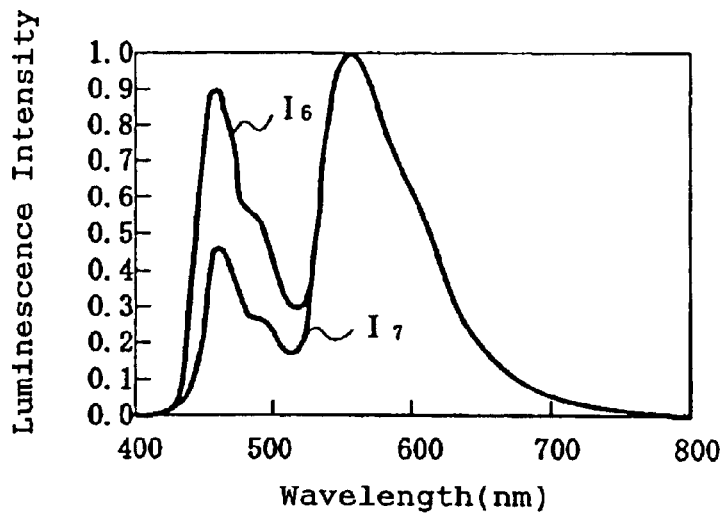
FIG. 2(C) is a graph showing emission spectra of organic EL elements of samples 6 and 7.
Figure 2D:
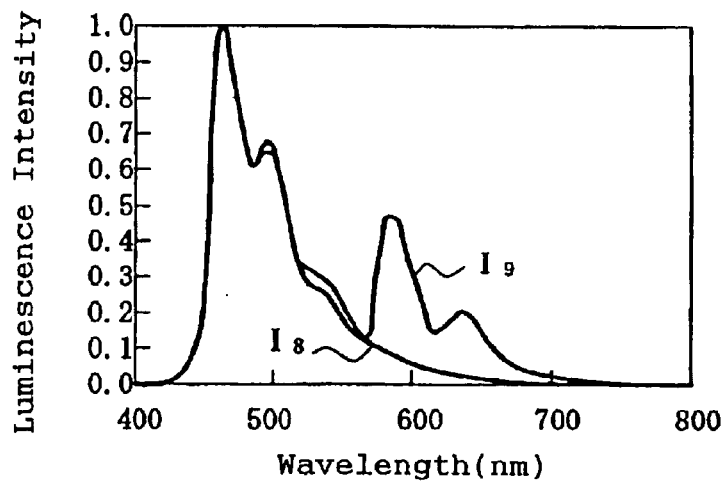
FIG. 2(D) is a graph showing emission spectra of organic EL elements of samples 8 and 9.
Figure 2E:
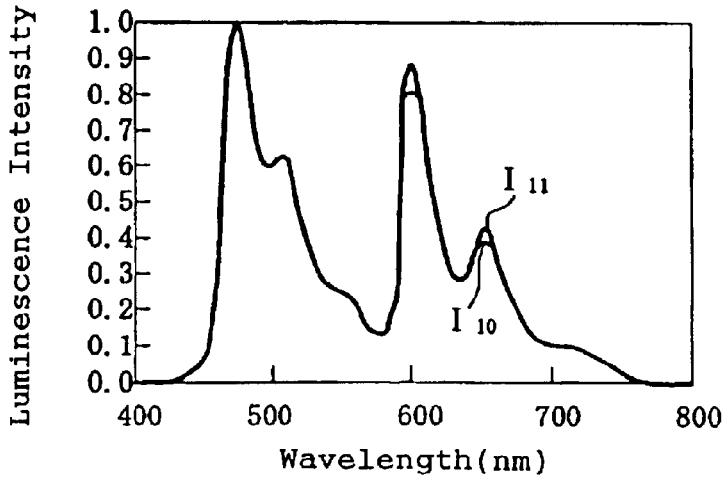
FIG. 2(E) is a graph showing emission spectra of organic EL elements of samples 10 and 11.

The respective constituting elements will be described hereinafter.

1. Organic EL Element

In the organic EL element, besides a emitting layer, the following can be used if necessary: a hole injection layer, an electron injection layer, an organic semiconductor layer, an electron barrier layer, an adhesion improving layer, and so on.

Representative structural examples of the organic EL element are shown below.

Anode/emitting layer/cathode
Anode/hole injection layer/emitting layer/cathode
Anode/emitting layer/electron injection layer/cathode
Anode/hole injection layer/emitting layer/electron injection/cathode
Anode/organic semiconductor layer/luminous layer/cathode
Anode/organic semiconductor layer/electron barrier layer/emitting layer/cathode
Anode/hole injection layer/emitting layer/adhesion-improving layer/cathode (1) Anode As the anode, there is preferably used an anode using, as an electrode material, a metal, an alloy, an electrically conductive compound having a large work function (4 eV or more), or a mixture thereof.

Specific examples of such an electrode material include metals such as Au, and electrically conductive transparent materials such as CuI, ITO, $SnO_2$ and ZnO.

(2) Emitting Layer

The emitting material of the organic EL element is mainly an organic compound. Specifically, dependently on a desired color tone, examples thereof are as follows.

First, in the case that luminescence of from the ultraviolet ray range to violet color is obtained, compounds represented by the following chemical formula (1) are given:

(1)

In this general formula, X represents a compound represented by the following chemical formula (2):

(2)

wherein n is 2, 3, 4 or 5, and Y represents a compound represented by the following chemical formula (3):

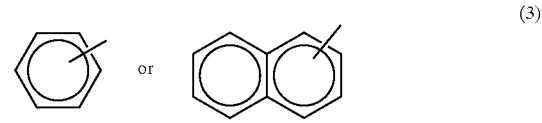

(3)

The phenyl group, the phenylene group or the naphthyl group of the above-mentioned compounds may be substituted with one or more groups out of alkyl groups having 1 to 4 carbon atoms, alkoxy groups, a hydroxyl group, a sulfonyl group, a carbonyl group, an amino group, a dimethylamino group, a diphenylamino group and so on. These may be bonded to each other to form a saturated 5-membered or 6-membered ring. Substituents bonded to the phenyl, phenylene or naphthyl:group at the para-positions are preferred for forming a smooth vapor-deposition film because of a high bonding ability. Specifically, compounds represented by the following chemical formulae (4) to (8) are given. Particularly preferred are p-quarterphenyl derivatives and p-quinquephenyl derivatives.

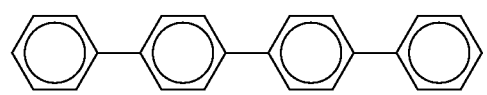

(4)

p-quarterphenyl (PQP)

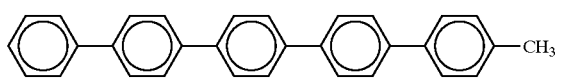

(5)

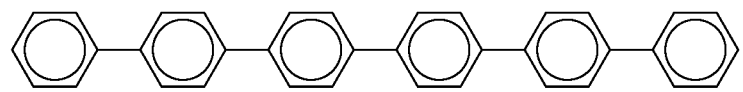

(6)

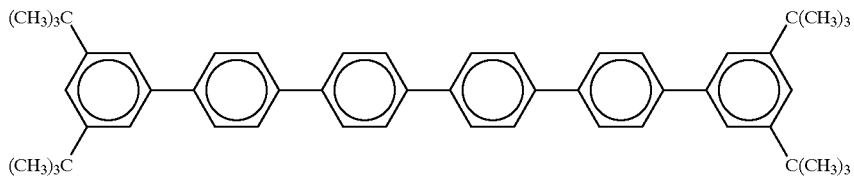

(7)

3, 5, 3''''', 5'''''-tetra-t-butyl-sexiphenyl (TBS)

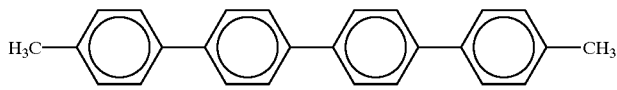

(8)

Secondly, in order to obtain luminescence of from blue color to green color, for example, the following can be given: benzothiazole-based, benzoimidazole-based, and benzoxazole-based fluorescent bleaching agents, metal-chelated oxynoid compounds, and styryl benzene-based compounds.

Specific compounds include compounds disclosed in JP-A No. 59-194393. Typical examples thereof include benzoxazole-based, benzothiazole-based, and benzoimidazole-based fluorescent bleaching agents.

Moreover, other useful compounds are listed up in Chemistry of Synthetic Dyes, 1971, pages 628 to 637 and 640.

As the chelated oxynoid compounds, for example, compounds disclosed in JP-A No. 63-295695 can be used. Typical examples thereof include 8-hydroxyquinoline-based metal complexes such as tris(8-quinolinol) aluminum (abbreviated to Alq hereinafter), and dilithium epintridione.

As the styryl benzene-based compounds, there can be used, for example, compounds disclosed in EP No. 0319881 and EP No. 0373582.

A distyrylpyrazine derivative disclosed in JP-A No. 2-252793 can also be used as the material of the emitting layer.

Besides, for example, a polyphenyl-based compound disclosed in EP No. 0387715 can also be used as the material of the emitting layer.

Besides the above-mentioned fluorescent bleaching agents, metal-chelated oxynoid compounds, and styryl benzene-based compounds, for example, the following can also be used as the material of the emitting layer:

12-phthaloperynone (J. Appl. Phys. vol. 27, L713 (1988), and 1,4-diphenyl-1,3-butadiene and 1,1,4,4-tetraphenyl-1,3-butadiene (Appl. Phys. Lett. vol. 56, L799 (1990)),
naphthalimide derivatives (JP-A No. 2-305886),
perylene derivatives (JP-A No. 2-189890),
oxadiazole derivatives (JP-A No. 2-216791 or oxadiazole derivatives disclosed in 38$^{th}$, Combined Lecture Meeting related to Applied Physics by Hamada et al.),
aldazine derivatives (JP-A No. 2-220393),
pyrazoline derivatives (JP-A No. 2-220394),
cyclopentadiene derivatives (JP-A No. 2-289675),
pyrrolopyrrole derivatives (JP-A No. 2-296891),
styrylamine derivatives (Appl. Phys. Lett., vol. 56, L799 (1990)), coumalin-based compounds (JP-A No. 2-191694),
polymer compounds as described in International Publication WO90/13148, Appl. Phys. Lett. vol. 58, 18, P1982 (1991), or the like.

In the present invention, it is particularly preferred to use an aromatic dimethylidyne-based compound (disclosed in EP No. 0388768 and JP-A No. 3-231970) as the material of the emitting layer.

Specific examples thereof include:

4,4'-bis(2,2-di-t-butylphenylvinyl)biphenyl (abbreviated to DTBPBBi hereinafter),
4,4'-bis(2,2-diphenylvinyl)biphenyl (abbreviated to DPVBi hereinafter), and derivatives thereof.

Furthermore, compounds represented by a general formula $(R_s\text{-}Q)_2\text{-}AL\text{-}O\text{-}L$ and described in JP-A No. 5-258862 are also given, wherein L is a hydrocarbon containing a phenyl moiety and having 6 to 24 carbon atoms, O-L is a phenolate ligand, Q represents a substituted 8-quinolinolate ligand, and $R_s$ represents an 8-quinolinolate ring substituent selected to hinder three-dimensionally the phenomenon that more than two substituted 8-quinolinolate ligands are bonded to the aluminum atom.

Specific examples thereof include:

bis(2-methyl-8-quinolinolate)(para-phenylphenolate) aluminum (III) (abbreviated to PC-7 hereinafter), and
bis(2-methyl-8-quinolinolate)(1-naphtholate)aluminum (III) (abbreviated to PC-17 hereinafter).

Besides, there can be given a method of obtaining mixed luminescence in blue and green colors, having a high efficiency, in which doping described in JP-A No. 6-9953 or the like is used. In this case, examples of a host are the above-mentioned emitting materials, and a dopant may be a fluorescent dye exhibiting intense light of from blue to green colors, examples of which include coumalin-based fluorescent dyes and the same fluorescent dyes as used as the above-mentioned host.

Specific examples of the host include emitting materials having a distyrylarylene skeleton. particularly preferred are, for example, DPVBi and 4,4"-bis(2,2-diphenylvinyl)-9',10'-diphenylanthracene. Examples of the dopant for blue luminescence include diphenylaminovinylarylenes. Particularly preferred are, for example, N,N-diphenylaminovinylbenzene (DPAVB), 1,4-bis[2-{4-(N,N-di-m-tolylamino)phenyl}vinyl]benzene, and N,N'-diphenyl-N,N'-bis[4-(2-phenylvinyl)phenyl]-4,4'-diaminostyrylbenzene.

The kind of the emitting layer for obtaining white luminescence is not particularly limited, and examples thereof include:

(1) a product in which energy levels of respective layers of an organic EL laminated structure are specified and light is emitted using tunnel injection (EP-A No. 0390551);

(2) a display device using tunnel injection in the same manner as the (1), Example of which is a white light emitting display device (JP-A No. 3-230584);
(3) a product including an emitting layer having a bi-layered structure (JP-A Nos. 2-220390 and 2-216790);
(4) a product in which an emitting layer is divided into plural layers and they are made of materials having different emitting wavelengths (JP-A No. 4-51491);
(5) a product having a structure in which a blue luminous body (fluorescence peak: 380 to 480 nm) and a green luminous body (480 to 580 nm) are laminated on each other, and a red fluorescent body is contained (JP-A No. 6-207170); and
(6) a product having a structure in which a blue luminous layer has a region containing a blue fluorescent dye and a green luminous layer has a region containing a red fluorescent dye, and further a green fluorescent body is contained (JP-A No. 7-142169).

In particular, the technique having the structure (5) is preferably used.

The method for obtaining luminescence rays having a long wavelength of 550 to 580 nm out of the green luminescence rays described herein and red luminescence rays may be a method based on doping. In this case, examples of a host may be the above-mentioned luminous materials, and examples of a dopant for yellow luminescence include 5,6,11,12-tetraphenylnaphthacene, and 3,10-bis(diphenylamino)-7,14-diphenylacetonaphthofluoranthene, and examples of a dopant for orange luminescence include Lumogen F red, phenoxazone, dicyanomethylenepyran, and 6,13-bisdiphenyl-α-benzpentacene.

In order to obtain the bluish green light of the present invention, there can be used "compounds for obtaining luminescence of from the ultraviolet ray range to violet" as well as the above-mentioned "compounds for obtaining luminescence of from blue color to green color". In order to obtain the bluish green red light of the present invention, the above-mentioned "compounds for obtaining white luminescence" can be used.

(3) Hole Injection Layer

Examples of a hole injection material constituting the hole injection layer include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, fluorenone derivatives, hydrazone derivatives, styrylanthracene derivatives, stylbene derivatives, silazane derivatives, polysilane, aniline-based copolymers, and electrically conductive macromolecular oligomers (in particular, thiophene oligomers), one of which or any combination of two or more selected from which may be used.

(4) Electron Injection Layer

Examples of an electron injection material constituting the electron injection layer include tris(8-quinolinolate)aluminum, tris(8-quinolinolate)gallium, bis(10-benzo[h]quinolinolate)beryllium, triazole derivatives, oxadiazole derivatives, triazine derivatives, perylene derivatives, quinoline derivatives, quinoxaline derivatives, diphenylquinone derivatives, nitro-substituted fluorenone derivatives, and thiopyran dioxide derivatives, one of which or any combination of two or more selected from which may be used.

It is also preferred to add, to such an electron injection material, an alkali metal, an alkaline earth metal, a rare earth metal, an alkali compound, an alkaline earth compound, a rare earth compound, an alkali metal to which an organic compound is coordinated, as a dopant.

(5) Cathode

As the cathode, there is preferably used a cathode using, as an electrode material, a metal, an alloy, an electrically conductive compound having a small work function (4 eV or less), or a mixture thereof. Specific examples of such an electrode material include sodium, sodium-potassium alloy, magnesium, lithium, magnesium-silver alloy, aluminum/aluminum oxide ($Al_2O_3$), aluminum-lithium alloy, indium, and rare earth metals, one of which or any combination of two or more selected from which may be used.

2. Color-Converting Member

As the color-converting member, for example, a fluorescent dye and a binder resin, or only a fluorescent dye can be used.

(1) Fluorescent Dye

Examples of the fluorescent dye for converting luminescence of from the near ultraviolet ray range to violet from the organic EL element to blue luminescence include stylbene-based dyes such as 1,4-bis(2-methylstyryl)benzene (abbreviated to Bis-MSB hereinafter) and trans-4,4'-diphenylstylbene (abbreviated to DPS hereinafter), and coumalin-based dyes such as 7-hydroxy-4-methylcoumalin (referred to as coumalin 4 hereinafter), one of which or any combination of two or more selected from which may be used.

Examples of the fluorescent dye for converting luminescence of from blue to bluish green from the organic EL element to green luminescence include coumalin dyes such as 2,3,5,6-1H,4H-tetrahydro-8-trifluoromethylquinolidino (9,9a,1-gh) coumalin (referred to as coumalin 153 hereinafter), 3-(2'-benzothiazolyl)-7-diethylaminocoumalin (referred to as coumalin 6 hereinafter), 3-(2'-benzimidazolyl)-7-N,N-diethylaminocoumalin (referred to as coumalin 7 hereinafter), and naphthalimide dyes such as Basic Yellow 51, Solvent yellow 11 and Solvent Yellow 116, one of which or any combination of two or more selected from which may be used.

Examples of the fluorescent dye for converting luminescence of from blue to green from the organic EL element to luminescence of from orange to red include cyanine-based dyes such as 4-dicyanomethylene-2-methyl-6-(p-dimethylaminostyryl-4H-pyran (abbreviated to DCM hereinafter), pyridine-based dyes such as 1-ethyl-2-(4-(p-dimethylaminophenyl)-1,3-butadienyl)-pyridinium-perchlorate (referred to as pyridine 1 hereinafter), and rhodamine-based dyes such as Rhodamine B and Rhodamine 6G, oxazine-based dyes, one of whichior any combination of two or more selected from which may be used.

Various dyes (such as direct dyes, acid dyes, basic dyes, and disperse dyes) may be used if they have fluorescence.

There may be used pigments in which a fluorescent dye is beforehand kneaded into a pigment resin such as polymethacrylic acid ester, polyvinyl chloride, vinyl chloride/vinyl acetate copolymer, alkyd resin, aromatic sulfonamide resin, urea resin, melamine resin, benzoguanamine resin or the like.

(2) Binder Resin

As the binder resin, there may be used a non-curing resin, a photocuring resin, a thermosetting resin such as epoxy resin, or the like. These binder resins may be used alone or in combination of two or more thereof.

For a full-color device, in order to separate and arrange the color-converting member two-dimensionally, it is preferred to use, as the binder resin, a photosensitive resin to which photolithography can be applied.

(1) Photosensitive Resin

Preferred examples thereof include one selected from photosensitive resins having a reactive vinyl group (photocuring resist materials), such as acrylic acid-based resins, methacrylic acid-based resins, polyvinyl cinnamate-based resin, and hard rubber-based resins; and mixture of two or more thereof.

The above-mentioned photosensitive resin is made from a reactive oligomer, a polymerization initiator, a polymerization accelerator and a monomer as a reactive diluting agent. Examples of the reactive oligomer suitable for using herein are as follows:

epoxy acrylates in which acrylic acid is added to a bisphenol type epoxy resin or a novolac type epoxy resin;

polyurethane acrylates in which a polyfunctional isocyanate is reacted with 2-hydroxyethyl acrylate and a polyfunctional alcohol, the mole numbers of which are equal, at an arbitrary mole ratio;

polyester acrylates in which a polyfunctional alcohol is reacted with acrylic acid and a polyfunctional carboxylic acid, the mole numbers of which are equal, at an arbitrary mole ratio;

polyether acrylates in which a polyol is reacted with acrylic acid;

reactive polyacrylates in which epoxy groups of side chains of poly(methyl methacrylate-CO-glycidyl methacrylate) or the like are reacted with acrylic acid;

carboxyl-modified epoxy acrylates in which an epoxy acrylate is partially modified with a dibasic carboxylic acid anhydride;

carboxyl-modified reactive polyacrylates in which a reactive polyacrylate is partially modified with a dibasic carboxylic acid anhydride;

polybutadiene acrylates having an acrylate group on a side of a polybutadiene oligomer;

silicone acrylates having, on its main chain, a polysiloxane bond; and amino-plast resin acrylates, in which an amino-plast resin is modified.

The polymerization initiator is not particularly limited if it is generally used in polymerization reaction of a vinyl monomer or the like. Examples thereof include organic peroxides such as benzophenones, acetophenones, benzoins, thioxanthones, anthraquniones, and azobisisobutyronitrile.

Preferred examples of the polymerization accelerator include triethanolamine, 4,4'-dimethylaminobenzophenone (Michler's ketone), and ethyl 4-dimethylaminobenzoate. Examples of a monomer as the reactive diluting agent, for example, for radical polymerization system include mono-funtional monomers such as acrylic acid esters and methacrylic acid esters; polyfunctional monomers such as trimethylolpropane triacrylate, pentaerythritol triacrylate and dipentaerythritol hexaacrylate; and oligomers such as polyester acrylate, epoxy acrylate, urethane acrylate and polyether acrylate.

(2) Non-Curing Resin

As the non-curing binder resin, there is preferably used, for example, polymethacrylic acid ester, polyvinyl chloride, vinyl chloride/vinyl acetate copolymer, alkyd resin, aromatic sulfonamide resin, urea resin, melamine resin, or benzoguanamine resin. Among these binder resins, benzoguanamine resin, melamine resin, and vinyl chloride resin are particularly preferred. These binder resins may be used alone or in combination of two or more thereof.

Besides the above-mentioned binder resins, a binder resin for dilution may be used. Examples thereof include polymethyl methacrylate, polyacrylate, polycarbonate, polyester, polyvinyl alcohol, polyvinyl pyrrolidone, hydroxyethylcellulose, carboxymethylcellulose, polyamide, silicone and epoxy resins, one of which or any combination of two or more selected from which may be used.

(3) Additive

As an additive, a substance satisfying the relationship of $^3Eq < ^3Ed$ wherein $^3Eq$ represents the lowest excited triplet energy level of the additive and $^3Ed$ represents the lowest excited triplet energy level of the fluorescent dye. In the case of a composition in which plural fluorescent dyes are mixed, the additive is selected in such a manner that the above-mentioned relationship is satisfied for the fluorescent dye having a fluorescent peak of the longest wavelength.

(1) Reason Why this Relationship is Required

When excitation light is radiated onto any one of the color-converting members, the fluorescent dye in a ground state absorbs the excitation light to transit to an excited singlet state. After the lifetime thereof, which is from several of nanoseconds to several hundreds of nanoseconds, passes, the excited singlet state returns into the ground state while fluorescence is emitted. By such a phenomenon, the excitation light is effectively converted to light having a desired wavelength. Although the excited singlet state is an electronically active state, the lifespan thereof is short. Therefore, the fluorescent dye trends not to interact easily with the binder resin.

However, the fluorescent dye excited into the singlet state necessarily undergoes intersystem crossing at a certain probability, so as to be transmitted to an excited triplet state. Since the excited triplet state has a longer excitation lifetime, which is from several hundreds of nanoseconds to several thousands of microseconds, as compared with the excited singlet state, the fluorescent dye interacts with the binder resin so that the structure of the dye is liable to change. Thus, when the color-converting member is continuously irradiated with excitation light for a long time, a phenomenon that the fluorescence lowers gradually is generated.

To suppress such a phenomenon, such an additive that receives energy from the fluorescent dye in the excited triplet state should be added. For this purpose, it is necessary that the lowest excited state of the additive, that is, the energy level of the lowest excited triplet is lower than the triplet energy level of the fluorescent dye.

It is generally known that one of substances for receiving energy from the triplet state of the fluorescent dye is oxygen since the ground state of oxygen is a triplet state. However, it is known that oxygen easily promotes deterioration of any organic EL element. It is therefore difficult to use oxygen positively as an agent for suppressing a drop in the fluorescence of the fluorescent dye. Thus, it is necessary to add the additive having the above-mentioned relationship.

(2) Desired Addition Ratio to the Fluorescent Dye

When the lowest excited singlet energy level of the additive is represented by $^1Eq$ and the lowest excited singlet energy level of the fluorescent dye is represented by $^1Ed$, a desired addition ratio varies dependently on large and small relationship between these levels.

(i) In the case of $^1Eq > ^1Ed$, the additive can be incorporated within the range of 0.01 to 100 times larger than the mole concentration of the fluorescent dye in the resin composition. If the multiplying factor is lower than 0.01, substantial effect of suppressing a drop in the fluorescence cannot be obtained. If the multiplying factor is larger than 100 times, the additive particles aggregate so that the substantial suppressing-effect cannot be obtained.

(ii) In the case of $^1E_q<^1E_d$, the additive can be incorporated within the range of 0.01 to 5 times larger than the mole concentration of the fluorescent dye. If this multiplying factor is lower than 0.01, substantial effect of suppressing a drop in the fluorescence cannot be obtained. If the multiplying factor is over 10 times, energy from the excited singlet state of the fluorescent dye to the additive is easily shifted so that the initial fluorescence of the color-converting member is low for practical utility.

(3) Lower Limit of the Excited Triplet Energy Level of the Additive

If the excited triplet energy level of the additive is too low for the fluorescent dye, overlap of energy bands becomes small so that energy from the fluorescent dye to the additive is not easily shifted. It is therefore preferred to select an additive satisfying $0.7\times^3E_d<^3E_q<^3E_d$.

(4) Transition Probability from the Lowest Excited Singlet State to the Lowest Excited Triplet State When the possibility of transition from the lowest excited singlet state of the additive to the lowest excited triplet state thereof is large, the additive gets energy from the excited fluorescent dye so that the excited triplet of the additive is easily generated. Specifically, the probability is preferably 0.5 or more.

(5) Specific Examples of the Additive

Specific examples of the additive are listed up below.

Among these examples, the following examples are given as an additive which has an energy level suitable for the excited triplet of a rhodamine-based dye and is easily transited to a triplet state, as a material which produces an effect, in particular, for suppressing deterioration of the red-converting member using the rhodamine-based dye:

anthracene derivatices: anthracene, 9-chloroanthracene, 9,10-dibromoanthracene, 9,10-dichloroanthracene, 9,10-dicyanoanthracene, 9-methylanthracene, 9-phenylanthracene, and so on;
azulene derivatives: azulene, guaiazulene, and so on,
thiobenzophenone derivatives: thiobenzophenone, 4,4'-bis (dimethylamino) thiobenzophenone, 4,4'-dimethoxy thiobenzophenone, and so on;
porphin derivatives: porphin, tetraphenylporphin, and so on;
C60 derivatives: C60 and so on;
C70 derivatives: C70 and so on;
Thionin derivatives: thionin and so on;
Oxazine-based dyes; and
azure-based dyes.

(4) Production Process

Any one of the color-converting members can be obtained by forming a resin composition for the color-converting member into the form of a film having a desired thickness on a substrate made of glass or the like by coating or the like.

When the film is formed, in order to enhance the dispersibility of the above-mentioned respective components, it is advisable to use a solvent to dissolve and mix the components. As the solvent suitable for the use herein, preferred is ethylene glycol monomethyl ether, ethylene glycol monoethyl ether, 2-acetoxy-1-methoxypropane, 1-acetoxy-2-ethoxyethane, cyclohexanone, toluene, or the like.

The manner of forming the film may be a known manner, such as spin coating, printing, or coating. Spin coating is preferred. The thickness of the color-converting member in the case of forming the film in this way is set to a thickness necessary for converting incident light into light having a desired wavelength. The thickness is appropriately selected within the range of usually 1 to 100 $\mu$m, preferably of 1 to 20 $\mu$m.

To obtain a full-color luminous device by fluorescence-converting process, it is necessary to arrange color-converting members in the three primary colors R, G and B two-dimensionally on a substrate. For this purpose, after formation of films as described above, the films are etched by photolithography, heated and hardened in accordance with a process for producing an ordinary color-converting member, to yield the color-converting members. About the heating temperature herein, a preferred temperature is selected dependently on the kind of the photoresist material. It is advisable to conduct the heating treatment within the range of 70 to 240° C. for 0.5 to 3 hours.

3. Color Filter

Examples of a color filter include an interference filter, a band pass filter, which are each made of an inorganic material, and a color filter made of an organic material. The organic material color filter, which is rich in materials such as dyes and is easy to work, is preferred. Examples of the color filter material include the following dyes, and solid substance in which any one thereof is dissolved or dispersed in a binder resin.

(1) Red (R) Dyes:

Perylene-based pigments, lake pigments, azo pigments, quinacridone-based pigments, anthraquinone-based pigments, anthracene-based pigments, isoindoline-based pigments, isoindolinone-based pigments, and mixtures thereof.

(2) Green (G) Dyes:

Halogen-multisubstituted phthalocyanine-based pigments, halogen-multisubstituted copper phthalocyanine-based pigments, triphenylmethane-based basic dyes, isoindoline-based pigments, isoindolinone-based pigments, and mixture thereof.

(3) Blue (B) Dyes:

Copper phthalocyanine-based pigments, indanthrone-based pigments, indophenol-based pigments, cyanine-based pigments, dioxazine-based pigments, and mixture thereof.

As the binder resin, a transparent material (having a transmittance of 50% or more within the range of visible rays) is preferably used. Examples thereof are transparent resins (polymers) such as polymethyl methacrylate, polyacrylate, polycarbonate, polyvinyl alcohol, polyvinyl pyrrolidone, hydroxyethylcellulose, and carboxymethylcellulose, one of which or any combination of two or more selected from which may be used.

The ratio of the dye to the binder resin is preferably from 1:99 to 90:10 (weight ratio). If the amount of the dye is less than 1%, the color filter cannot cut surrounding light sufficiently. If the amount is more than 90%, the property of the film deteriorates so that the mechanical strengths thereof such as adhesion strength lower. As a result, the film becomes brittle. The ratio of the dye to the binder resin is more preferably from 10:90 to 50:50 (weight ratio). The film thickness of the color filter, which can be set within an arbitrary range as far as the function of the color filter is not damaged, is usually from 1 to 10 mm, preferably from 100 to 500 $\mu$m, and more preferably from 1 to 10 $\mu$m.

In the case that the color filter is two-dimensionally separated and arranged, it is preferred to use, as the binder resin, a photosensitive resin to which photolithography can be applied. Examples thereof include photocuring resist materials having a reactive vinyl group, such as acrylic acid-, methacrylic acid-, polyvinyl cinnamate-, and cyclic rubber-type reactive vinyl groups, one of which or any combination of two or more selected from which may be used.

In the case of using printing, printing ink (medium) using a transparent resin can be used. Examples of the transparent resin include transparent resins such as polyvinyl chloride, polyvinylidene chloride, melamine resin, phenol resin, alkyd resin, epoxy resin, polyurethane, polyester, maleic acid resin, compositions made of monomers, oligomers and polymers of polyamide, polymethyl methacrylate, polyacrylate, polycarbonate, polyvinyl alcohol, polyvinyl pyrrolidone, hydroxyethylcellulose, and carboxymethylcellulose, one of which or any combination of two or more selected from which may be used.

The color filter is usually produced by mixing, dispersing or dissolving the dye(s) and the resin(s) with/into a suitable solvent into a liquid form, and then forming the liquid into a film onto a given substrate by spin coating, roll coating, bar coating, casting, or the like. The color filter may be made into a dry film, and then adhered to a given substrate. In the case that the color filter is patterned, the patterning is generally performed by photolithography, screen printing or the like.

For such a color filter, only one layer is basically sufficient when a full-color or multicolor luminous device which emits light rays in the three primary colors is produced. Thus, the structure thereof is simple and the production can be attained at low costs.

4. Substrate

Examples of the substrate include a glass substrate, a metal plate, a ceramic plate and a plastic plate (polycarbonate resin, acrylic resin, vinyl chloride resin, polyethylene terephthalate resin, polyimide resin, polyester resin, epoxy resin, phenol resin, silicone resin, fluorine resin or the like).

In order to avoid break-in of water into the color luminous device, it is preferred to subject the substrate made of any one of these resins to moisture proofing treatment or hydrophobic treatment by forming an inorganic film thereon or applying a fluorine resin thereto.

Accordingly, in order to avoid the entry of water into the luminous medium, it is preferred to make the water content or the gas permeation coefficient in the substrate small by moisture proofing treatment or hydrophobic treatment. Specifically, it is preferred to set the water content in the supporting substrate and the gas permeation coefficient thereof to 0.0001% by weight or less and $1 \times 10^{-13}$ cc·cm/cm$^2$·sec·cmHg or less, respectively.

[Embodiment 1]

Embodiments of the present invention will be described, referring to the drawings.

FIG. 1 is a schematic view of a color luminous device of one embodiment of the present invention. In this figure, reference number 100 represents the color luminous device; 200, an organic EL element which emits bluish green red light containing a blue component, a green component, and a red component; 300, a color-converting member containing a fluorescent dye; 400, a color filter; 120, a blue pixel; 140, a green pixel; and 160, a red pixel.

The color-converting member 300 contains a green-converting member 340 for receiving light which the organic EL element emits, to absorb the blue component, emit fluorescence of the green component and transmit the green component and the red component, and a red-converting member 360 for receiving light which the organic EL element emits, to absorb either or both of the blue component and the green component, emit fluorescence of the red component and transmit the red component.

The color filter 400 contains a blue color filter 420 for blocking the green component and the red component but transmitting the blue component, a green color filter 440 for blocking the blue component and the red component but transmitting the green component, and a red color filter 460 for blocking the blue component and the green component but transmitting the red component.

The blue pixel 120 contains the blue color filter 420, the green pixel 140 contains the green-converting member 340 and the green color filter 440, and the red pixel 160 contains the red-converting member 360 and the red color filter 460.

The following will describe the action thereof.

From the organic EL element 200, bluish green red light is emitted, which contains the blue component (B), the green component (G) and the red component (R).

In the blue pixel 120, the blue component, the green component and the red component transmit, as they are, into the color-converting member 300, and the blue color filter 420 blocks the green component and the red component. As a result, only blue light is emitted from the blue color filter 420.

In the green pixel 140, the green-converting member 340 absorbs the blue component to emit fluorescence of the green component. The green-converting member 340 transmits the green component and the red component as they are. Next, the green color filter 440 blocks the red component, and the blue component which is not sufficiently converted in the green-converting member 340 so as to be transmitted. Consequently, only green light is emitted from the green color filter 440.

In the red pixel 160, the red-converting member 360 absorbs either or both of the blue component and the green component to emit fluorescence of the red component. The red-converting member 360 transmits the red component as it is. Next, the red color filter 460 blocks the blue component and the green component which are not sufficiently converted in the red-converting member 360 so as to be transmitted. Consequently, only red light is emitted from the red color filter 460.

As described above, the respective color filters 420, 440 and 460 block unnecessary color components. As a result, color reproducibility becomes better.

Color display elements can be classified into a top emission type and a lower side taking-out type. In the lower side taking-out type color display elements, a substrate, a color filter 400, a color-converting member 300, and an organic EL element 200 are arranged in this order, and light is taken out from the-side of the substrate. In the top emission type color display elements, a substrate, an organic EL element 200, a color-converting member 300, and a color filter 400 are arranged in this order, and light is taken out from the side opposite to the substrate.

In this embodiment, the organic EL element is described as a single member common to the respective pixels, but the organic EL element may be formed separately in each of the pixels.

[Embodiment 2] Simulation

Furthermore, emission spectra and white balance (balance between luminescence intensities of red, green and blue colors in the case of white display) of 11 kinds of organic EL elements in the color luminous device shown in FIG. 1 were obtained by simulation.

(Simulation Method)

The simulation method herein is a method for obtaining emission spectra taken out from the color filter in the color luminous device shown in FIG. 1 without actual measurement, and is a method found out by the present inventor. The simulation method is based on the fact that the inventor experimentally found out that the emission spectrum of a color-converting member does not depend on the emission spectrum of the organic EL element but depends on the number of effective photons which contribute to light emission of the color-converting member. Details thereof are described in Japanese Patent Application No. 2000-360187.

According to the method, the luminescence emission spectrum $WL(\lambda)$ of light taken out from a color filter can be obtained from the following equation:

$$WL(\lambda) = \{w(\lambda) \cdot 10^{-Abs(\lambda)} + lu(\lambda) \cdot F/F_0\} \cdot T_{CF}(\lambda)$$

$$F/F_0 = \{\int \lambda \cdot w(\lambda) \cdot EX(\lambda) d\lambda\} / \{\int \lambda \cdot el(\lambda) \cdot EX(\lambda) d\lambda\}$$

wherein $F_0$ represents the number of effective photons which contribute to light emission of the color-converting member in the case of using a standard light source as the organic EL element, F represents the number of effective photons which contribute to light emission of the color-converting member in the case of using a light source other than the standard light source as the organic EL element, $\lambda$ represents wavelength, $W(\lambda)$ represents the normalized luminescence emission spectrum of the light source other than the standard light source, $Abs(\lambda)$ represents the absorption spectrum of the color-converting member, $lu(\lambda)$ represents the normalized spectrum obtained by normalizing, with the emission spectrum of the standard light source, a net luminescence emission spectrum from the color-converting member in the case of using the standard light source, $EX(\lambda)$ represents the excitation spectrum of the color-converting member, $el(\lambda)$ represents the spectrum obtained by normalizing the emission spectrum of the standard light source, and $T_{CF}(\lambda)$ represents the transmittance spectrum of the color filter.

Furthermore, the luminance L of the color luminous device can be obtained from the following equation:

$$L = L_0 \cdot \eta$$

$$\eta = \{\int WL(\lambda) \cdot y(\lambda) d\lambda\} / \{\int el(\lambda) \cdot y(\lambda) d\lambda\}$$

wherein $\eta$ represents luminance conversion efficiency, $L_0$ represents the luminance of the standard light source, and $y(\lambda)$ represents $y^-(\lambda)$ of the color matching function in the XYZ color coordinate system of CIE1931.

Furthermore, the CIE chromaticity coordinate (X, Y) of the color luminous device can be obtained from the following equation:

$$X = \{\int WL(\lambda) \cdot x(\lambda) d\lambda\} / \{\int WL(\lambda) \cdot x(\lambda) d\lambda + \int WL(\lambda) \cdot y(\lambda) d\lambda + \int WL(\lambda) \cdot z(\lambda) d\lambda\}$$

$$Y = \{\int WL(\lambda) \cdot y(\lambda) d\lambda\} / \{\int WL(\lambda) \cdot x(\lambda) d\lambda + \int WL(\lambda) \cdot y(\lambda) d\lambda + \int WL(\lambda) \cdot z(\lambda) d\lambda\}$$

wherein $x(\lambda)$ and $z(\lambda)$ represent $x^-(\lambda)$ and $z^-(\lambda)$ of the color matching functions in the XYZ color coordinate system of CIE1931, respectively.

Furthermore, in the color luminous device, the CIE chromaticity coordinate (Xh, Yh) of a white point based on combination of pixels in the three primary colors can be obtained from an equation described below.

First, from the above-mentioned equation, luminances $L_R$, $L_G$ and $L_B$ are calculated, and further chromaticity coordinates $(R_x, R_y)$, $(G_x, G_y)$ and $(B_x, B_y)$ are obtained. From the following equation, these luminances and chromaticity coordinates are used to calculate the chromaticity coordinate (Xh, Yh) of the white point.

$$Xh = \{L_R \cdot R_x/R_y + L_G \cdot G_x/G_y + L_B \cdot B_x/B_y\} / \{L_R/R_y + L_G/G_y + L_B/B_y\}$$

$$Yh = \{L_R + L_G + L_B\} / \{L_R/R_y + L_G/G_y + L_B/B_y\}$$

(Simulation Results)

First, compositions of samples 1 to 11, which are organic EL elements, are shown in Table 1.

As is shown in the leftmost column in Table 1, the organic EL elements are classified into A type elements of samples 1 to 3, B type elements of samples 4 to 7, and C type elements of samples 8 to 11.

The A to C type elements have a structure of anode/hole injection layer/hole transport layer/emitting layer/electron injection layer/cathode. The emitting layer is made of a host material and one or more selected from various dopants, as described below.

In samples 1 to 3 of the A type elements, the luminous layers thereof are each made of a mixture of a host material/a dopant for yellow luminescence, and the ratios therebetween are 40/0, 40/0.04, and 40/0.14 (weight ratios), respectively.

In samples 4 to 7 of the B type elements, the luminous layers thereof are each made of a mixture of a host material/a dopant for blue luminescence/a dopant for yellow luminescence, and the ratios therebetween are 40/1/0.04, 40/1/0.08, 30/0.9/0.06, and 30/1.5/0.1 (weight ratios), respectively.

In samples 8 to 11 of the C type elements, the emitting layers thereof are each made of a mixture of a host material/ another dopant for blue luminescence/a dopant for orange luminescence, and the ratios therebetween are 40/1/0, 40/1/0.1, 40/1/0.15, and 40/1/0.2 (weight ratios), respectively.

Additionally, Table 1 also shows results of the CIE chromaticity coordinates and so on in the case that white color is displayed in the organic EL elements of samples 1 to 11, which results are obtained by the above-mentioned simulation method.

TABLE 1

| | | R | | | G | | | B | |
|---|---|---|---|---|---|---|---|---|---|
| | Conversion efficiency | Chromaticity x | Chromaticity y | Conversion efficiency | Chromaticity x | Chromaticity y | Conversion efficiency | Chromaticity x | Chromaticity y |
| A type element | | | | | | | | | |
| 1  40/0 | 30.8% | 0.645 | 0.348 | 84.3% | 0.234 | 0.694 | 16.4% | 0.141 | 0.048 |
| 2  40/0.04 | 21.4% | 0.646 | 0.351 | 51.7% | 0.317 | 0.652 | 4.5% | 0.162 | 0.063 |
| 3  40/0.14 | 21.2% | 0.648 | 0.351 | 44.6% | 0.354 | 0.629 | 2.6% | 0.218 | 0.093 |

TABLE 1-continued

|  |  | R | | | G | | | B | | |
|---|---|---|---|---|---|---|---|---|---|---|
|  |  | Conversion efficiency | Chromaticity x | Chromaticity y | Conversion efficiency | Chromaticity x | Chromaticity y | Conversion efficiency | Chromaticity x | Chromaticity y |
|  |  | B type element | | | | | | | | |
| 4 | 40/1/0.04 | 23.5% | 0.647 | 0.350 | 54.6% | 0.309 | 0.655 | 5.9% | 0.157 | 0.056 |
| 5 | 40/1/0.08 | 22.4% | 0.648 | 0.350 | 49.3% | 0.330 | 0.643 | 4.1% | 0.171 | 0.064 |
| 6 | 30/0.9/0.06 | 21.8% | 0.647 | 0.351 | 49.5% | 0.330 | 0.644 | 4.0% | 0.171 | 0.064 |
| 7 | 30/1.5/0.1 | 21.2% | 0.648 | 0.351 | 45.9% | 0.348 | 0.633 | 2.8% | 0.198 | 0.079 |
|  |  | C type element | | | | | | | | |
| 8 | 40/1/0 | 20.4% | 0.645 | 0.350 | 60.8% | 0.237 | 0.695 | 9.8% | 0.128 | 0.084 |
| 9 | 40/1.0/0.1 | 28.5% | 0.648 | 0.349 | 49.1% | 0.281 | 0.659 | 8.7% | 0.150 | 0.089 |
| 10 | 40/1/0.15 | 33.1% | 0.649 | 0.349 | 41.6% | 0.315 | 0.632 | 7.8% | 0.169 | 0.096 |
| 11 | 40/1/0.2 | 33.9% | 0.650 | 0.348 | 40.7% | 0.319 | 0.628 | 7.8% | 0.172 | 0.097 |

Secondly, on the basis of the simulation results shown in Table 1, in FIGS. 2(A) to (D), emission spectra of light rays emitted from the organic EL elements of samples 1 to 11 are shown by curves $I_1$ to $I_{11}$, respectively. Vertical axes in graphs shown in these figures each represent luminescence intensity, and horizontal axes thereof each represent wavelength (nm).

Only sample 1, among these samples, has a emission spectrum having a single peak within the wavelength range of the blue component, as is represented by the curve $I_1$.

The peak herein means a maximum point of the luminescence emission spectrum curve.

On the other hand, the other samples 2 to 11 each exhibit a emission spectrum having peaks within the wavelength range of the blue component and the wavelength range of the component(s) other than the blue component, respectively, as shown by the curves $I_2$ to $I_{11}$.

In other words, samples 2 to 8 each have peaks of the luminescence emission spectrum within the wavelength ranges of the blue component and the green component, respectively, as shown by the curves $I_2$ to $I_8$. Samples 9 to 11 each have peaks of the luminescence emission spectrum within the wavelength ranges of the blue component, the green component, and the red component, respectively, as shown by the curves $I_9$ to $I_{11}$.

The blue component means visible rays having a wavelength within the range of 430 to 490 nm, and the green component means visible rays having a wavelength within the range of 490 to 590 nm. The red component means visible rays having a wavelength within the range of 590 to 810 nm.

Figure 3:
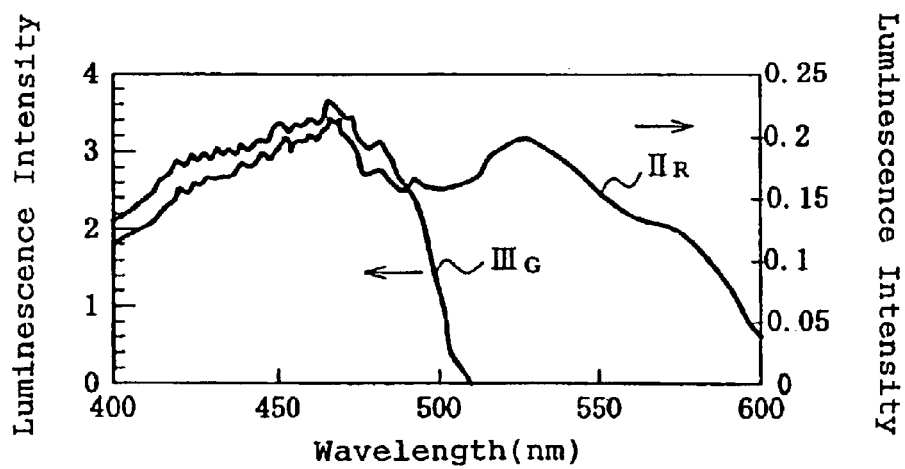
FIG. 3 is a graph showing excitation spectra of a red-converting member and a green-converting member.

FIG. 3 shows excitation spectra of the red-converting member and the green-converting member used in the simulation. The excitation spectra are each obtained by dividing the spectrum intensity $I(\lambda)$, measured by scanning the fluorescent material within the wavelength range of 380 to 600 nm by means of a spectrometer, by the emission spectrum intensity $L(\lambda)$ of the light source of the spectrometer.

In the graph of FIG. 3, the left vertical axis thereof represents the excitation intensity of the green-converting member, and the right vertical axis thereof represents the excitation intensity of the red-converting member. The horizontal axis thereof represents wavelength (nm). Curve $II_R$ shows the excitation spectrum of the red-converting member for converting either or both of the blue component and the green component to the red component. As shown by the curve $II_R$, the excitation spectrum of the red-converting member has excitation intensity peaks within the second half range of the level of 400 nm and the first half range of the level of 500 nm.

The curve $II_G$ shows the excitation spectrum of the green-converting member for converting the blue component to the green component. As shown by the curve $II_G$, the excitation spectrum of the green-converting member has an excitation intensity peak within the second half of the level of 400 nm, and excitation intensity is hardly measured at the side longer than the vicinity of 500 nm.

Figure 4:
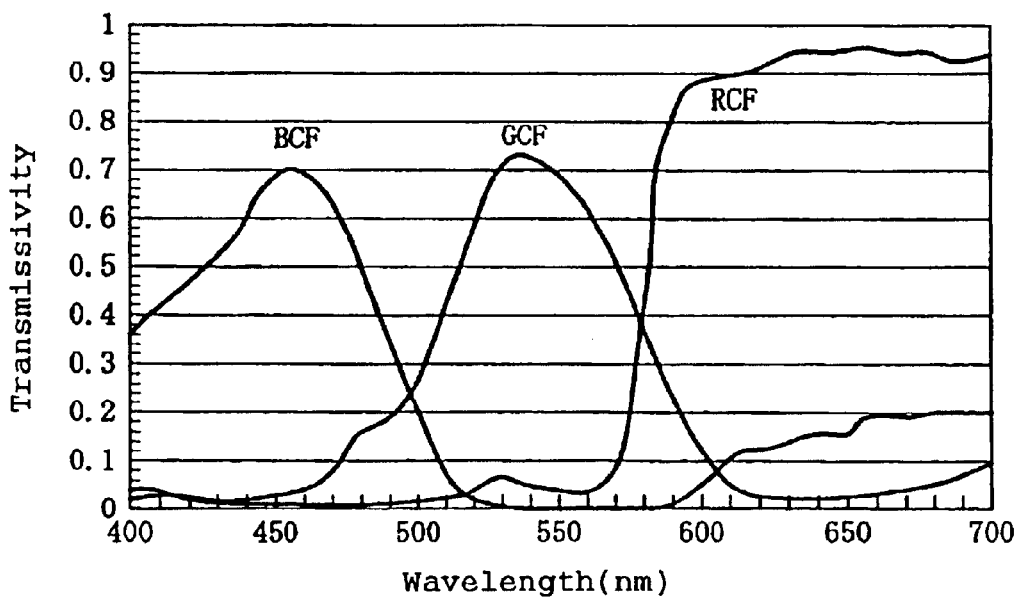
FIG. 4 is a graph showing transmission spectra of respective color filters.

FIG. 4 shows transmission spectra of respective color filters. The vertical axis of this graph represents transmittance and the horizontal axis thereof represents wavelength (nm). BCF, GCF and RCF represent a blue color filter, a green color filter, and a red color filter, respectively.

The following will describe emission spectra taken out from a color filter in a color luminescence device using an organic EL element using one of the above-mentioned samples, and the red-converting member and the green-converting member having the above-mentioned excitation spectra, referring to FIG. 5.

Figure 5A:
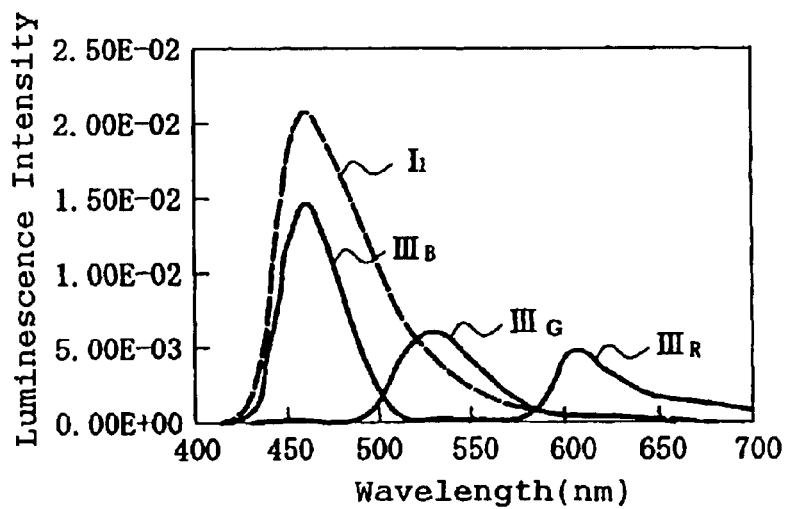
FIG. 5(A) is a graph showing emission spectra of blue, green and red pixels in the case of using an organic EL element which emits light including only a blue component.

First, as a comparative example, in the graph of FIG. 5(A), luminescence emission spectra of blue, green and red pixels using sample 1 are shown. The vertical axis of the graph represents luminescence intensity and the horizontal axis thereof represents wavelength (nm). The curve $I_1$ in the graph shows the emission spectrum of the organic EL element of sample 1 containing only the blue component, as described above.

Curves $III_B$, $III_G$, and $III_R$ in the graph show emission spectra taken out from the color filter in the case that light rays are emitted from the blue, green, and red pixels, respectively, at a uniform driving voltage. As shown in the graph of FIG. 5(A), peak intensities that the curves $III_G$ and $III_R$ exhibit are remarkably lower than a peak intensity that the curve $III_B$ exhibits. It can be therefore understood that according to the color luminous device, at the time of displaying white color is bluish and white balance is destroyed.

As described above, in the case that the emission spectrum of the EL element is made of only the blue component, good white balance cannot be easily obtained.

Figure 5B:
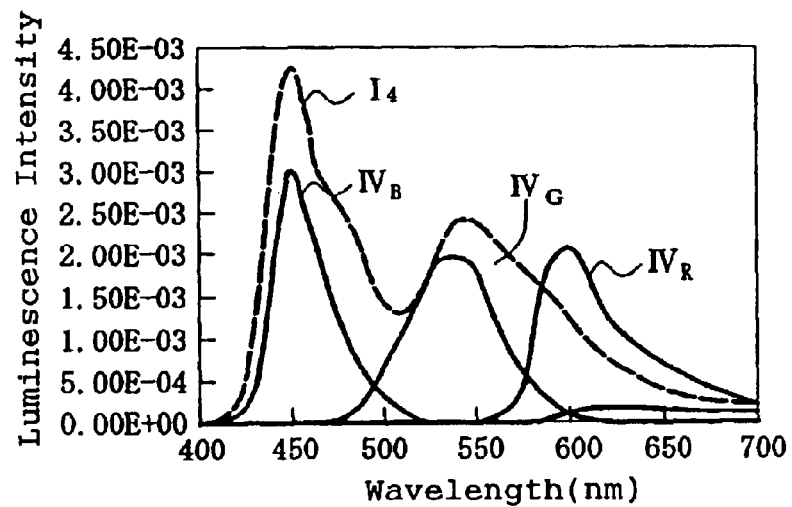
FIG. 5(B) is a graph showing emission spectra of blue, green and red pixels in the case of using an organic EL element which emits light including blue and green components.

Secondly, as a preferred example of the present invention, in the graph of FIG. 5(B), luminescence emission spectra of blue, green and red pixels in the case of using sample 4 are shown. The vertical axis of the graph represents luminescence intensity and the horizontal axis thereof represents wavelength (nm). The curve $I_4$ in the graph shows the emission spectrum of the organic EL element of sample 4 containing the blue component and the green component, as described above.

Curves $IV_B$, $IV_G$, and $IV_R$ in the graph show emission spectra taken out from the color filter in the case that light rays are emitted from the blue, green, and red pixels, respectively, at a uniform driving voltage. As shown in the graph of FIG. 5(B), intensity difference between the peaks that each of the curves $IV_B$, $IV_G$ and $IV_R$ exhibits is smaller than in the comparative example. Therefore, the color luminous device can keep good white balance at the time of displaying white color.

Figure 5C:
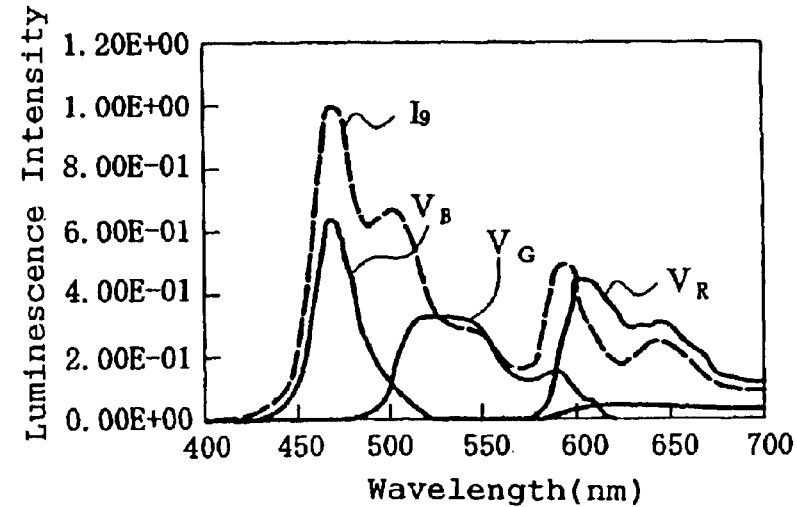
FIG. 5(C) is a graph showing emission spectra of blue, green and red pixels in the case of using an organic EL element which emits light including blue, green and red components.
Figure 6:
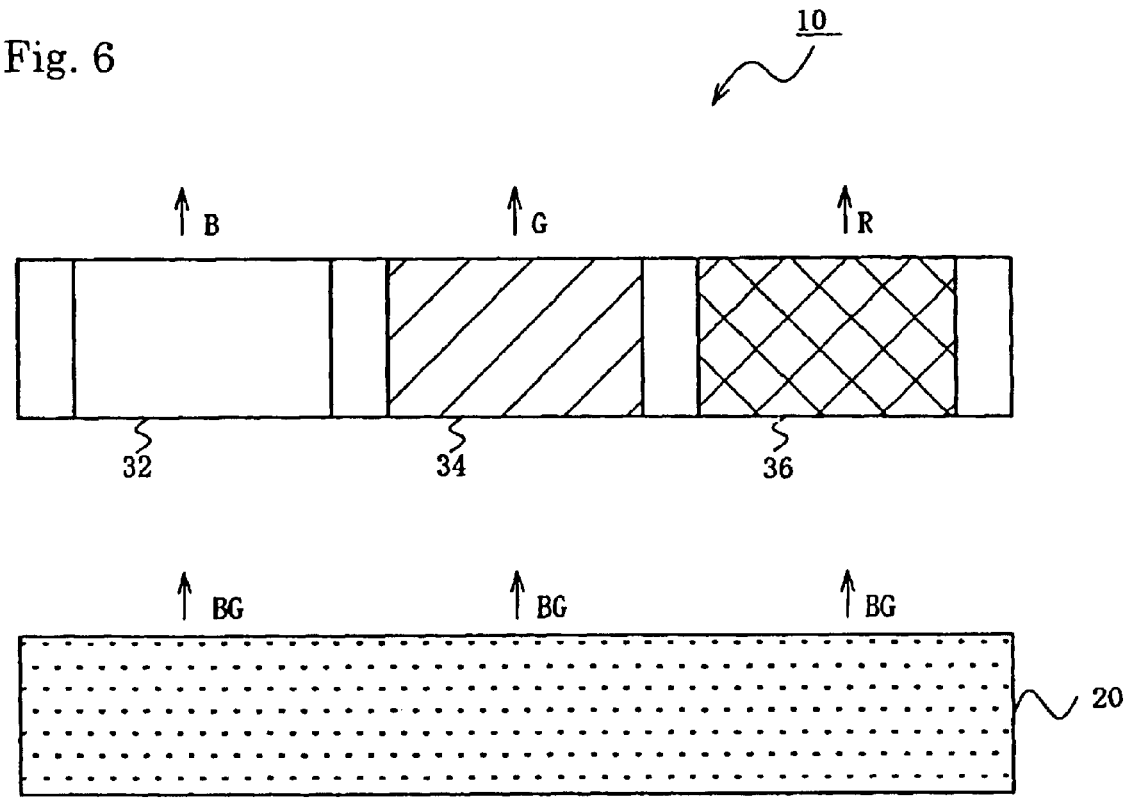
FIG. 6 is a schematic view of a color luminous device in the related art.

Thirdly, as a preferred example of the present invention, in the graph of FIG. 5(C), emission spectra of blue, green and red pixels in the case of using sample 9 are shown. The vertical axis of the graph represents luminescence intensity and the horizontal axis thereof represents wavelength (nm). The curve $I_0$ in the graph shows the emission spectrum of the organic EL element of sample 9 containing the blue component and the green component, as described above.

Curves $V_B$, $V_G$, and $V_R$ in the graph show emission spectra taken out from the color filter in the case that light rays are emitted from the blue, green, and red pixels, respectively, at a uniform driving voltage. As shown in the graph of FIG. 5(C), intensity difference between the peaks that each of the curves $V_B$, $V_G$ and $V_R$ exhibits is smaller than in the comparative example. Therefore, the color luminous device can keep good white balance at the time of displaying white color.

As described above, it has been found out that when the luminescence emission spectrum of an organic EL element has peaks within the wavelength ranges of the blue component and a color component other than the blue component, respectively, good white balance can be obtained.

INDUSTRIAL APPLICABILITY

As described in detail, the present invention makes it possible to provide a color luminous device from which improved light rays in the three primary colors can be emitted.

What is claimed is:

1. A color luminous device, comprising:
   an organic electroluminescent element that emits light having peaks within the wavelength ranges of the blue component and the green component, respectively, and
   a blue pixel, a green pixel, and a red pixel that receive the light that the organic electroluminescent element emits, and emit blue color, green color, and red color, respectively,
   wherein the blue pixel contains a blue color filter that blocks the green component but transmits the blue component,
   the green pixel contains:
   a green-converting member that receives the light that the organic electroluminescent element emits, absorbs the blue component to emit fluorescence of the green component, and transmits the green component, and
   a green color filter that blocks the blue component but transmits the green component, and
   the red pixel contains:
   a red-converting member that receives the light that the organic electroluminescent element emits and absorbs either one or both of the blue component and the green component to emit fluorescence of a red component, and
   a red color filter that blocks the blue component and the green component but transmits the red component.

2. The color luminous device according to claim 1, further comprising a substrate,
   wherein the substrate, the color filter, the color-converting member and the organic elecroluminescent element are arranged in this order.

3. The color luminous device according to claim 1, further comprising a substrate,
   wherein the substrate, the organic electroluminescent element, the color-converting member and the color filter are arranged in this order.

4. A color luminous device, comprising:
   an organic electroluminescent element that emits light having peaks within the wavelength ranges of the blue component, the green component, and the red component, respectively, and
   a blue pixel, a green pixel, and a red pixel that receive the light that the organic electroluminescent element emits, and emit blue color, green color, and red color, respectively,
   wherein the blue pixel contains a blue color filter that blocks the green component and the red component but transmits the blue component,
   the green pixel contains:
   a green-converting member that receives the light that the organic electroluminescent element emits, absorbs the blue component to emit fluorescence of the green component, and transmits the green component and the red component, and
   a green color filter that blocks the blue component and the red component but transmits the green component, and the red pixel contains:
   a red-converting member that receives the light that the organic electroluminescent element emits, absorbs either one or both of the blue component and the green component to emit fluorescence of the red component, and transmits the red component, and
   a red color filter that blocks the blue component and the green component but transmits the red component.

5. The color luminous device according to claim 4, further comprising a substrate,
   wherein the substrate, the color filter, the color-converting member and the organic elecroluminescent element are arranged in this order.

6. The color luminous device according to claim 4, further comprising a substrate,
   wherein the substrate, the organic electroluminescent element, the color-converting member and the color filter are arranged in this order.

* * * * *